United States Patent
Downes, Jr. et al.

[19]

[11] Patent Number: 5,994,910
[45] Date of Patent: Nov. 30, 1999

[54] APPARATUS, AND CORRESPONDING METHOD, FOR STRESS TESTING WIRE BOND-TYPE SEMI-CONDUCTOR CHIPS

[75] Inventors: Francis Joseph Downes, Jr., Vestal; Anthony Paul Ingraham; Jaynal Abedin Molla, both of Endicott, all of N.Y.

[73] Assignee: International Business Machines Corporation, Armonk, N.Y.

[21] Appl. No.: 09/160,057

[22] Filed: Sep. 24, 1998

Related U.S. Application Data

[62] Division of application No. 08/360,920, Dec. 21, 1994, abandoned.

[51] Int. Cl.⁶ .......................... G01R 1/073; G01R 31/02
[52] U.S. Cl. ............................................. 324/757; 324/755
[58] Field of Search .................................. 324/754, 755, 324/757, 758, 765; 439/68, 71, 74

[56] References Cited

U.S. PATENT DOCUMENTS

| | | | |
|---|---|---|---|
| 4,597,617 | 7/1986 | Enochs ..................................... | 439/68 |
| 4,783,719 | 11/1988 | Jamison et al. ........................... | 439/68 |
| 5,123,850 | 6/1992 | Elder et al. ............................... | 439/68 |
| 5,302,891 | 4/1994 | Wood et al. .............................. | 324/765 |
| 5,402,077 | 3/1995 | Agahdel et al. .......................... | 324/758 |
| 5,468,157 | 11/1995 | Roebuck et al. .......................... | 439/71 |

OTHER PUBLICATIONS

"New Products Test Interposer"; Research Disclosure; #30956; Jan. 1990.
"Decal Contactor with Decoder"; Research Disclosure; #32636; Jun. 1991.

*Primary Examiner*—Ernest Karlsen
*Attorney, Agent, or Firm*—Lawrence R. Fraley

[57] ABSTRACT

An apparatus, and a corresponding method, for stress-testing wire bond-type semiconductor chips is disclosed. The apparatus includes a clamp housing, with a spring-loaded screw extending through the top end of the housing. Contained within the clamp housing is a substantially rigid, electrically insulating base plate positioned at a lower end of the clamp housing. The upper surface of the base plate includes a depression which contains an insert fabricated either from an elastomeric material or a semiconductor material, such as silicon. A flexible, electrically insulating layer made from, for example, polyimide, overlies the base plate and insert. Significantly, the upper surface of the flexible, electrically insulating layer includes a plurality of dendritic contacts. It is through these dendritic contacts that electrical contact is made to the contact pads of a wire bond-type semiconductor chip.

19 Claims, 2 Drawing Sheets

APPARATUS, AND CORRESPONDING METHOD, FOR STRESS TESTING WIRE BOND-TYPE SEMI-CONDUCTOR CHIPS

This application is a divisional application of Ser. No. 08/360,920, filed Dec. 21, 1994, now abandoned.

BACKGROUND OF THE INVENTION

1. Field of the Invention

The invention pertains to an apparatus, and a corresponding method, for stress testing wire bond-type semiconductor chips, i.e., semiconductor chips having contact pads to which wire bonds are to be attached.

2. Description of the Related Art

There is now a great need to detect faulty semiconductor integrated circuit devices (hereinafter referred to as semiconductor chips) before such semiconductor chips are mounted onto electronic packages, such as multi-chip modules (MCMs). This need arises from the fact that if a faulty chip is detected only after it is mounted onto, for example, an MCM, it may be necessary to scrap the entire MCM, even though the other semiconductor chips on the MCM are not defective.

Stress testing of semiconductor chips, i.e., electrically testing semiconductor chips while subjecting the chips to elevated temperatures, is now recognized as an effective method for detecting faulty chips before such chips are mounted onto, for example, MCMs. As a result, the development of apparatuses for carrying out such stress testing, particularly apparatuses which can be used to sequentially test a large number of individual semiconductor chips, has become important. Because wire bond-type semiconductor chips, i.e., semiconductor chips having electrical contact pads to which wire bonds are to be attached, are the most common type of semiconductor chips, the development of apparatuses for carrying out stress testing of wire bond-type semiconductor chips has become particularly important.

One apparatus which has been developed to achieve stress testing of wire bond-type semiconductor chips includes a clamp housing containing a spring at its upper end. A substantially rigid and inflexible base is positioned at the lower end of the clamp housing. This base includes a depression in its upper surface, which contains an elastomeric insert. A flexible, polyimide layer overlies the base and insert. The upper surface of the flexible, polyimide layer includes a plurality of gold bumps.

In the operation of the above-described apparatus, a wire bond-type semiconductor chip is placed on the upper surface of the flexible, polyimide layer, directly over the elastomeric insert and directly beneath the spring. By pressing the clamp housing toward the base, a force is applied to the back of the semiconductor chip through the spring. As a result of this force, the contact pads on the semiconductor chip are brought into electrical contact with the gold bumps on the flexible, polyimide layer. While in this configuration, test voltages and/or test currents are applied to the gold bumps, and thereby applied to the contact pads, and the apparatus and semiconductor chip are heated to an elevated temperature.

Significantly, the total force which must be applied to the back of the semiconductor chip to achieve good electrical contact between the chip contact pads and the gold bumps corresponds to a force of 0.5 newtons or more being applied to each contact pad. This constitutes a relatively large force per chip contact pad and is thought to be due, in part, to the fact that each gold bump electrically contacts a corresponding chip contact pad at only a single point. Unfortunately, so large a force per chip contact pad often results in unacceptable, physical damage to the semiconductor chip.

Thus, those engaged in the development of apparatuses, and corresponding methods, for stress testing wire bond-type semiconductor chips have sought, thus far without success, apparatuses and methods which do not damage chips and which can be used to sequentially test a large number of chips.

SUMMARY OF THE INVENTION

The invention involves an apparatus, and a corresponding method, for stress testing wire bond-type semiconductor chips, which apparatus and method avoid physical damage to the chips. Moreover, the inventive apparatus can readily be used to sequentially stress test at least one hundred wire bond-type semiconductor chips and, it is believed, can be used to sequentially stress test as many as one thousand, and perhaps as many as ten thousand, wire bond-type semiconductor chips. The inventive apparatus includes a clamp housing, with a spring-loaded screw extending through a top end of the clamp housing. Contained within the clamp housing is a substantially rigid, electrically insulating base plate positioned at a lower end of the clamp housing. The upper surface of this base plate includes a depression which contains an insert fabricated either from an elastomeric material or a semiconductor material, such as silicon. A flexible, electrically insulating layer made from, for example, polyimide, overlies the base plate and insert. Significantly, the upper surface of the flexible, electrically insulating layer includes a plurality of dendritic contacts, instead of gold bumps. It is through these dendritic contacts that electrical contact is made to the contact pads of a wire bond-type semiconductor chip. By contrast with a gold bump, each dendritic contact electrically contacts a chip contact pad at a plurality of points, instead of a single point.

In the operation of the inventive apparatus, a wire bond-type semiconductor chip is placed on the upper surface of the flexible layer. The spring-loaded screw is then rotated to apply sufficient force to the back of the chip so that good electrical contact is made between the chip contact pads and the dendritic contacts. Importantly, this force corresponds to a force per contact pad which is less than, and usually substantially less than, 0.5 newtons. In fact, the force per contact pad can be as little as 0.2 newtons. As a consequence, the semiconductor chip suffers no physical damage.

BRIEF DESCRIPTION OF THE DRAWINGS

The invention is described with reference to the accompanying drawings, wherein.

DETAILED DESCRIPTION OF THE PREFERRED EMBODIMENT(S)

The invention involves an apparatus, and a corresponding method, for stress testing a wire bond-type semiconductor chip. Significantly, this apparatus and method involve the application of less than, and usually substantially less than, 0.5 newtons of force per chip contact pad, which serves to avoid physical damage to the chip. In fact, the applied force per chip contact pad can be as little as 0.2 newtons. Moreover, the inventive apparatus can readily be used to sequentially stress test at least one hundred, and perhaps as many as one thousand, and perhaps even as many as ten thousand, wire bond-type semiconductor chips.

Figure 1:
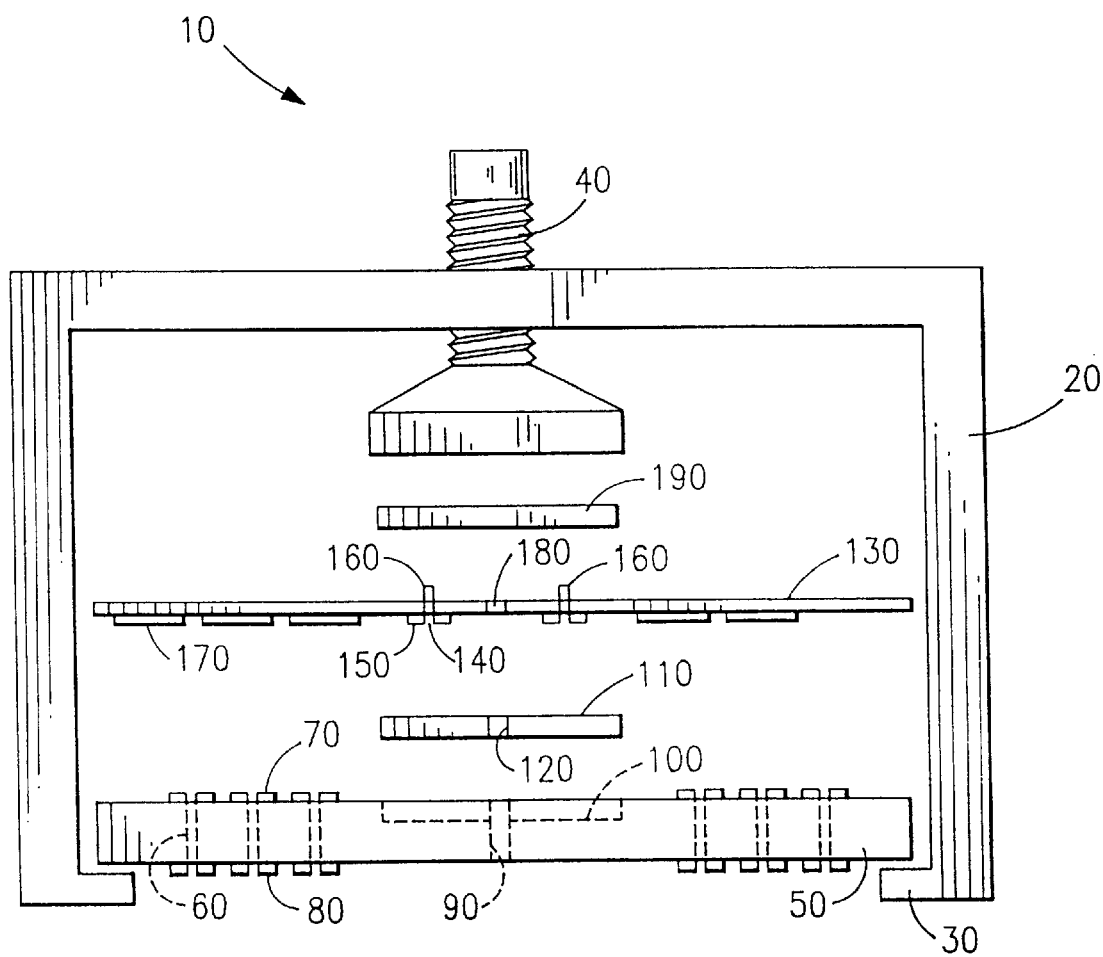
FIG. 1 is a partially exploded, cross-sectional view of the inventive apparatus.
Figure 2:
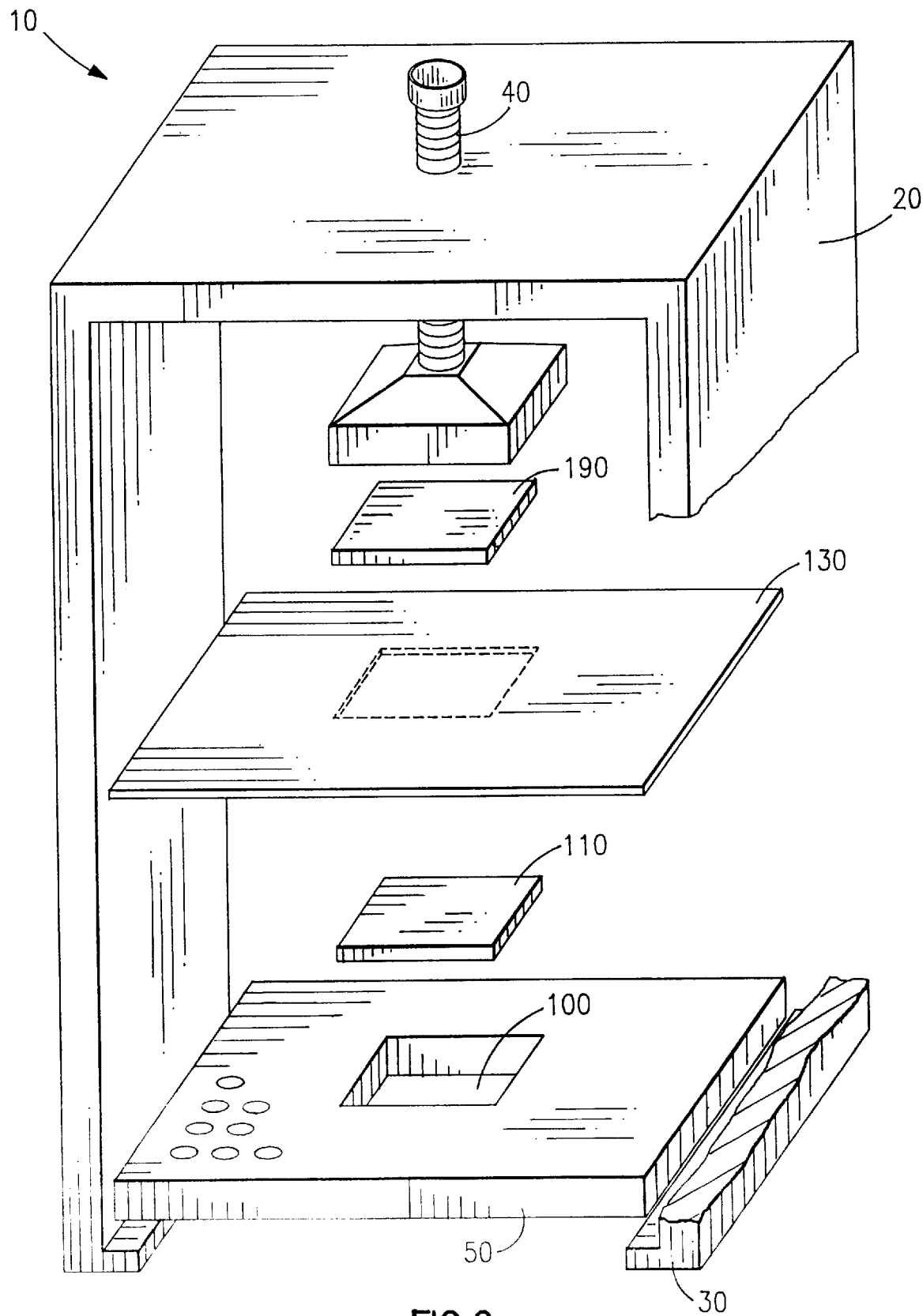
FIG. 2 is a partially exploded, perspective view of the inventive apparatus.

With reference to FIGS. 1 and 2, one embodiment of the inventive apparatus 10 includes a clamping fixture which itself includes a hollow, generally cylindrical clamp housing 20 fabricated from, for example, aluminum or steel. The bottom of the clamp housing 20 is open and includes a lip 30 projecting inwardly toward the center of the clamp housing 20. Rather than being integral with the clamp housing 20, as shown in FIGS. 1 and 2, the lip 30 may be connected to the clamp housing 20 via screws. Although not explicitly shown in FIGS. 1 and 2, the top of the clamp housing 20 is rotatably removable to permit insertion of a wire bond-type chip. A spring-loaded screw 40, which extends centrally through an aperture in the top of the clamp housing 20, permits the application of a force to a wire bond-type semiconductor chip, as explained more fully below.

A preferred alternative to the above-described clamping fixture is the clamping fixture described in U.S. application Ser. No. 08/163,452, filed by R. G. Charlton et al on Dec. 7, 1993, which is hereby incorporated by reference. This preferred alternative includes an upper portion and a lower portion, with the upper portion being rotatably insertable into the lower portion. The upper portion includes a relatively large heat sink, as well as a spring-loaded gimbal screw which extends centrally through the heat sink. The lower portion includes a body fixture which includes the lip described above.

The inventive apparatus 10 also includes a substantially rigid, electrically insulating base plate 50, positioned near the open bottom of the clamp housing 20 and resting on, and affixed to, the lip 30. (Substantially rigid, for purposes of the present invention, means that the base plate 50 has a Young's modulus of elasticity equal to or greater than about 5,000,000 psi.) If the lip 30 is connected to the clamp housing 20 via screws, then the base plate 50 is inserted between the clamp housing 20 and the lip 30, and the base plate 50 and lip 30 are connected to the clamp housing via the screws. This base plate 50 is fabricated from, for example, a plastic sold under the trade name Vespa by Du Pont of Wilmington, Del., U.S.A. The function of the base plate 50 is to provide an opposing force to the force applied to a wire bond-type semiconductor chip inserted into the clamp housing 20, as more fully discussed below.

The thickness of the base plate 50 ranges from about 0.120 inches to about 0.400 inches. Thicknesses less than about 0.120 inches are undesirable because the corresponding base plates are undesirably fragile and cannot provide the opposing force, mentioned above. Thicknesses greater than about 0.400 inches are unnecessary, i.e., they provide no additional advantage.

As shown in FIG. 1, the base plate 50 includes a plurality of holes 60, extending through the thickness of the base plate 50, which are either filled with an electrically conductive material, such as copper, or contain electrically conductive pins. The tops and bottoms of these holes include lands 70 and 80. The purpose of these holes and lands is to communicate test voltages and/or test currents to a wire bond-type semiconductor chip, as discussed more fully below.

The holes 60 are preferably spaced apart in a square, grid-like arrangement, where the corresponding grid size is 0.100 inches. If desired, additional holes 60 may be located at the center of each square of the grid.

The diameters of the holes 60 are preferably equal to or greater than about 0.040 inches. Diameters smaller than about 0.040 inches are undesirable because the corresponding holes are difficult to manufacture. If the diameters of the holes 60 are, for example, 0.040 inches, then the corresponding diameters of the lands 70 and 80 range from about 0.060 inches to about 0.080 inches. Land diameters smaller than about 0.060 inches are undesirable because it is difficult to electrically contact such small lands. Land diameters larger than about 0.080 inches are undesirable because they involve an undesirable increase in the possibility of electrical shorting between the lands.

In addition to the holes 60, the base plate 50 also includes a centrally located vacuum hold-down hole 90. The purpose of this hole 90 is to communicate a vacuum to a wire bond-type semiconductor chip, as discussed more fully below. The diameter of this vacuum hold-down hole 90 ranges from about 0.100 inches to about 0.250 inches. Diameters smaller than about 0.100 inches are undesirable because they result in undesirably fragile vacuum hold-down holes. Diameters greater than about 0.250 inches are unnecessary, i.e., they provide no additional advantage.

As shown in FIGS. 1 and 2, the base plate 50 includes a centrally located depression 100, which is sized to receive an insert 110. This insert 110 is either fabricated from an elastomeric material, such as the elastomeric material sold under the trade name Viton by Du Pont of Wilmington, Del., U.S.A., or from a semiconductor material, such as silicon. The lateral dimensions of the insert 110 are the same as those of the wire bond-type semiconductor chip to be tested.

If the insert 110 is made of, for example, an elastomeric material, then the thickness of the insert 110 ranges from about 0.010 inches to about 0.040 inches. Thicknesses less than about 0.010 inches are undesirable because such inserts exhibit insufficient compliancy, as more fully discussed below. Thicknesses greater than about 0.040 inches are unnecessary, i.e., they provide no additional advantage. If the insert 110 is made of, for example, silicon, then the insert is preferably a piece of a silicon wafer, which has a standard thickness of either 0.025 inches or 0.032 inches.

Like the base plate 50, the insert 110 includes a centrally located vacuum hold-down hole 120, aligned with the vacuum hold-down hole 90, which serves the same function as the vacuum hold-down hole 90.

Significantly, as shown in FIGS. 1 and 2, the apparatus 10 also includes a flexible, electrically insulating layer 130, which overlies the base plate 50 and insert 110. (For purposes of the present invention, flexible means that the layer 130 has a Young's modulus which is equal to or less than about 2,000,000 psi.) The layer 130 must be capable of withstanding the elevated temperatures employed in stress testing, e.g., a temperature of 180 degrees C. Consequently, the layer 130 is preferably of polyimide, such as the polyimide sold under the trade name Upilex by UBE Industries Inc. of Yamaguchi Prefecture, Japan, which readily withstands such temperatures.

If the flexible, electrically insulating layer 130 is of polyimide, then the thickness of the layer 130 preferably ranges from about 0.001 inches to about 0.003 inches. Thicknesses less than about 0.001 inches are undesirable because the corresponding layers are undesirably fragile. Thicknesses greater than about 0.003 inches are undesirable because the corresponding layers are rigid and lack the needed compliance, discussed below.

The flexible, electrically insulating layer 130 includes a plurality of holes 140 which extend through the thickness of the layer 130. The holes 140 are located at positions which correspond to the positions of contact pads on a wire bond-type semiconductor chip to be tested. These holes 140 are filled with an electrically conductive material, such as copper, which is readily deposited into the holes using, for example, conventional electrolytic plating techniques. The bottoms of the holes 140 terminate in lands 150, which have the same diameters as the lands 70 at the top of the base plate 50. When the inventive apparatus is assembled, the lands 150 are preferably attached to the lands 70 using a conductive epoxy.

Preferably, the diameters of the holes 140 range from about 0.002 inches to about 0.004 inches. Diameters less than about 0.002 inches are undesirable because it is extremely difficult, if not impossible, to electrolytically plate, for example, copper into such small diameter holes. On the other hand, diameters larger than about 0.004 inches are also undesirable because the dendritic contacts (discussed below) formed at the tops of such large diameter holes are too wide to fit into the conventional, recessed contact pads of a conventional wire bond-type semiconductor chip.

Significantly, dendritic contacts 160 of, for example, palladium extend from the tops of the holes 140. These dendritic contacts 160 are readily formed using the now conventional electroplating techniques described in, for example, U.S. Pat. No. 5,137,461, which is hereby incorporated by reference. It is these dendritic contacts which make direct electrical contact with the contact pads of a wire bond-type semiconductor chip.

The dendritic contacts 160 preferably extend from the tops of of the holes 140 by a distance ranging from about 0.0005 inches to about 0.002 inches. Distances less than about 0.0005 inches are undesirable because the corresponding dendritic contacts are so short that there is a significantly increased likelihood that they will fail to make good electrical contact to the chip contact pads. Distances greater than about 0.002 inches are undesirable because the corresponding dendritic structures exhibit undesirably low rigidity.

Attached to the bottom of the flexible, electrically insulating layer 130 is a patterned layer 170 of electrically conductive material, such as copper. This patterned, electrically conductive layer 170 constitutes fan-out circuitry which electrically connects various lands 150 at the bottom of the flexible, electrically insulating layer 130 to various lands 70 on the top of the base plate 50. If the thickness of the flexible, electrically insulating layer 130 ranges from about 0.001 inches to about 0.003 inches, then the corresponding thickness of the patterned layer 170 ranges from about 0.0003 inches to about 0.001 inches. Thicknesses less than about 0.0003 inches are undesirable because the patterned layer becomes susceptible to physical damage. Thicknesses greater than about 0.001 inches are undesirable because the combination of the flexible layer 130 and patterned layer 170 exhibits undesirably increased rigidity.

Like the base plate 50 and insert 110, the flexible, electrically insulating layer 130 and patterned layer 170 include a centrally located vacuum hold-down hole 180. This vacuum hold-down hole 180, which extends through both the layer 130 and layer 170, is aligned with the vacuum hold-down holes 120 and 90, and serves the same function as these other vacuum hold-down holes.

In the operation of the apparatus 10, the top of the clamp housing 20 is removed and a first vacuum pencil is used to place a wire bond-type semiconductor chip 190 onto the flexible layer 130, with the contact pads of the chip being positioned directly over the dendritic contacts 160. A second vacuum pencil is then applied to the vacuum hold down-hole 90 in order to apply vacuum to the bottom of the chip 190 and thereby hold the chip 190 in place, while the first vacuum pencil is withdrawn and the top of the clamp housing 20 is replaced. While still holding the chip 190 in place with the second vacuum pencil, the spring-loaded screw 40 is rotated downwardly until enough force is applied to the back of the chip 90 to maintain the chip in place. Then, the second vacuum pencil is withdrawn and the screw 40 is further rotated downwardly to apply sufficient force to the back of the chip 90 to achieve good electrical contact between the chip contact pads and the dendritic contacts 160. As noted above, this force corresponds to a force per chip contact pad which is substantially less then 0.5 newtons per chip contact pad, e.g., 0.2 newtons per chip contact pad. An electrical socket is applied to the bottom of the base plate 50, and test voltages and/or test currents are then communicated via the lands 80, holes 60, lands 70, fan-out circuitry 170, lands 150, holes 140 and dendritic contacts 160 to the chip contact pads. In addition, the apparatus 10 and chip 190 are heated via, for example, an oven to an elevated temperature, such as 180 degrees C.

In connection with the operation of the apparatus 10, it must be noted that the circuitry-bearing surface of a wire bond-type chip 190 is relatively flat and smooth compared to the upper surface of the base plate 50. Thus, if one were to form dendritic contacts on the upper surface of the base plate 50, place the chip 190 on these dendritic contacts and apply a force to the back of the chip 190 with the screw 40, there would be significant variability in the degree of electrical contact between the chip contact pads and the dendritic contacts. By contrast, in the present invention, such variability is avoided by having the dendritic contacts extend from the flexible layer 130, and by providing an elastomeric insert 110. It is the compliance exhibited by the flexible layer 130 and elastomeric insert 110 which serves to overcome what would otherwise be variability in the degree of electrical contact.

As an alternative to using an elastomeric insert 110, as noted above, the insert 110 may, for example, be a piece of a silicon wafer, of the type used to fabricate silicon integrated circuit devices. Therefore, in this circumstance, the upper surface of the insert 110 necessarily exhibits the same degree of flatness and smoothness as the circuitry-bearing surface of the chip 190. It is the combination of this insert flatness/smoothness and the compliance of the flexible layer 130 which also serves to overcome what would otherwise be variability in the degree of electrical contact.

While the invention has been particularly shown and described with reference to preferred embodiments thereof, it will be understood by those skilled in the art that various changes in form and details may be made therein without departing from the spirit and scope of the invention.

We claim:

1. An apparatus for electrically testing a semiconductor chip having a plurality of contact pads comprising:
   a housing including at least one wall and defining an open end;
   a substantially rigid, electrically insulating base plate, positioned within said open end of said housing and including a plurality of electrical conductors therein;
   a flexible, electrically insulating layer including first and second surfaces, contained within said housing and overlying said insulating base plate, said flexible, electrically insulating layer including a plurality of electrically conductive dendritic contacts extending from said first surface thereof and, a plurality of electrical conductors on said second surface; and a force application member positioned within said at least one wall of said housing and acting therethrough for engaging a semiconductor chip having a first surface and a plurality of contact pads, to force said plurality of contact pads of said semiconductor chip against said plurality of electrically conductive dendritic contacts on said first surface of said flexible, electrically insulating layer.

2. The apparatus of claim 1, wherein said electrically insulating base plate includes a depression adjacent an upper surface of said base plate.

3. The apparatus of claim 2, further comprising an insert positioned within said depression.

4. The apparatus of claim 3, wherein said insert is fabricated from an elastomeric material.

5. The apparatus of claim 3, wherein said insert is fabricated from silicon.

6. The apparatus of claim 1, wherein said flexible, electrically insulating layer has a composition which includes polyimide.

7. The apparatus of claim 1, wherein said flexible, electrically insulating layer includes a plurality of holes extending through said layer, said holes being aligned with said electrically conductive dendritic contacts and containing electrically conductive material.

8. The apparatus of claim 7, wherein said plurality of electrical conductors on said second surface of said flexible, electrically insulating layer extends from said holes.

9. The apparatus of claim 1, wherein said base plate includes a plurality of holes extending through said base plate.

10. The apparatus of claim 9, wherein each of said holes contains electrically conductive material therein.

11. The apparatus of claim 9, wherein each of said holes contains an electrically conductive pin.

12. The apparatus of claim 7, wherein selected ones of said holes include a diameter ranging from about 0.002 inches to about 0.004 inches.

13. The apparatus of claim 7, wherein said electrically conductive dendritic contacts extend from the tops of said holes a distance ranging from 0.0005 inches to about 0.002 inches.

14. The apparatus of claim 1, wherein said force application member is positioned to apply force only onto said first surface of said semiconductor chip.

15. The apparatus of claim 14, wherein said force application member comprises a spring-loaded screw.

16. The apparatus of claim 1, wherein said apparatus further includes a vacuum source for application of vacuum to said semiconductor chip.

17. The apparatus of claim 16, wherein said vacuum source is in contact with said semiconductor chip prior to application of said force by said force application member.

18. The apparatus of claims 16, wherein said vacuum source comprises a vacuum pencil.

19. The apparatus of claim 16, wherein said electrically insulating base plate further includes at least one opening, said vacuum source acting through said at least one opening.

* * * * *